United States Patent
Lee et al.

(10) Patent No.: US 7,759,764 B2
(45) Date of Patent: Jul. 20, 2010

(54) ELEVATED BIPOLAR TRANSISTOR STRUCTURE

(75) Inventors: Chuan-Ying Lee, Hsin-Chu (TW); Denny Duan-lee Tang, Saratoga, CA (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 226 days.

(21) Appl. No.: 11/698,346

(22) Filed: Jan. 26, 2007

(65) Prior Publication Data
US 2008/0099863 A1 May 1, 2008

Related U.S. Application Data

(60) Provisional application No. 60/855,486, filed on Oct. 31, 2006.

(51) Int. Cl.
*H01L 29/00* (2006.01)
*H01L 29/70* (2006.01)

(52) U.S. Cl. .................. 257/517; 257/526; 257/586

(58) Field of Classification Search .......... 257/514, 257/515, 517, 518, 526, 565, 586, E29.183, 257/E29.189, 427
See application file for complete search history.

(56) References Cited

U.S. PATENT DOCUMENTS

| | | | |
|---|---|---|---|
| 5,698,459 A * | 12/1997 | Grubisich et al. | 438/350 |
| 6,465,289 B1 | 10/2002 | Streit et al. | |
| 6,567,296 B1 | 5/2003 | Casagrande et al. | |
| 6,972,430 B2 | 12/2005 | Casagrande et al. | |
| 7,067,837 B2 | 6/2006 | Hwang et al. | |
| 2005/0112837 A1 * | 5/2005 | Gau | 438/309 |

FOREIGN PATENT DOCUMENTS

| | | |
|---|---|---|
| CN | 1131819 A | 9/1996 |
| CN | 1052341 C | 5/2000 |

OTHER PUBLICATIONS

Bedeschi, F., et al., "An 8Mb Demonstrator for High-Density 1.8V Phase-Change Memories," 2004 Symposium on VLSI Circuits Digest of Technical Papers, 2004, pp. 442-445, IEEE.

Pellizzer, F., et al., "Novel µTrench Phase-Change Memory Cell for Embedded and Stand-Alone Non-Volatile Memory Applications," 2004 Symposium on VLSI TEchnology Digest of Technical Papers, 2004, pp. 18-19, IEEE.

(Continued)

*Primary Examiner*—Hung Vu
(74) *Attorney, Agent, or Firm*—Slater & Matsil, L.L.P.

(57) ABSTRACT

A semiconductor structure includes a substrate; an isolation structure in the substrate, wherein the isolation structure defines a region therein; a first semiconductor region having at least a portion in the region defined by the isolation structure, wherein the first semiconductor region is of a first conductivity type; a second semiconductor region on the first semiconductor region, wherein the second semiconductor region is of a second conductivity type opposite the first conductivity type; and a third semiconductor region of the first conductivity type on the second semiconductor region, wherein the third semiconductor region has at least a portion higher than a top surface of the isolation structure.

19 Claims, 9 Drawing Sheets

OTHER PUBLICATIONS

Durlam, M., et al., "A 0.18μm 4Mb Toggling MRAM," IEDM, IEEE, 2003, pp. 995-997.

Motoyoshi, M., et al., "A Study for 0.18um High-Density MRAM," Symposium on VLSI Technology Digest of Technical Papers, IEEE, 2004, pp. 22-23.

Asao, Y., et al., "Design and Process Integration for High-Density, High-Speed, and Low-Power $6F^2$ Cross Point MRAM Cell," IEDM, IEEE, 2004, pp. 571-574.

Baek, I. G., et al., "MRAM with Lamellar Structure as Free Layer," IEDM, IEEE, 2003, pp. 831-834.

Debrosse, J., et al., "A 16Mb MRAM Featuring Bootstrapped Write Drivers," Symposium on VLSI Circuits Digest of Technical Papers, IEEE, 2004, pp. 454-457.

Tsuji, T., et al., "A 1.2V 1Mbit Embedded MRAM Core with Folded Bit-Line Array Architecture," Symposium on VLSI Circuits Digest of Technical Papers, IEEE, 2004, pp. 450-453.

Hung, C.C., et al., "High Density and Low Power Design of MRAM," IEDM, IEEE, 2004, pp. 575-578.

Ahn, S. J., et al., "Highly Manufacturable High Density Phase Change Memory of 64Mb and Beyond," IEDM, IEEE, 2004, pp. 907-910.

Cho, W. Y., et al., "A 0.18μm 3.0V 64Mb Non-Volatile Phase-Transition Random-Access Memory (PRAM)," IEEE International Solid-State Circuits Conference, Session 2, Non-Volatile Memory, vol. 2.1, 2004, 9 pages.

Gill, M., et al., "Ovonic Unified Memory—A High-Performance Nonvolatile Memory Technolgy for Stand Alone Memory and Embedded Applications," IEEE International Solid-State Circuits Conference, Session 12, TD:Digital Directions, vol. 12.4, 2002, 3 pages.

Pellizzer, F., et al., "A 90nm Phase Change Memory Technology for Stand-Alone Non-Volatile Memory Applications," Symposium on VLSI Technology Digest of Technical Papers, IEEE, 2006, 2 pages.

Lee, S. H., et al., "Full Integration and Cell Characterisitics for 64Mb Nonvolatile PRAM," Symposium on VLSI Technology Digest of Technical Papers, IEEE, 2004, pp. 20-21.

* cited by examiner

ELEVATED BIPOLAR TRANSISTOR STRUCTURE

This application claims the benefit of the following provisionally filed U.S. Patent application: Application Ser. No. 60/855,486, filed Oct. 31, 2006, entitled "Elevated Bipolar Transistor Structure," which patent application is incorporated herein by reference.

TECHNICAL FIELD

This invention relates generally to semiconductor devices, and more particularly to vertical bipolar transistors, and even more particularly to vertical bipolar transistors used as selectors for sensing states of memories.

BACKGROUND

Phase change technology is a promising technology for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1,000 and thus the phase change memory devices are unlikely to have errors for reading states. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase change random access memory (PRAM). Phase change memories have the advantageous feature of having small cell sizes, thus can be used for forming high-density memories.

One engineering challenge in improving PRAM devices is to provide enough programming current to effectuate the reversible phase change. Conventionally, MOS devices are used as selectors for the selection and programming of PRAM devices. However, MOS devices typically have relatively small driving currents. The reliability of the programming is thus adversely affected. Bipolar junction transistors (BJT) are thus preferred.

Figure 1:
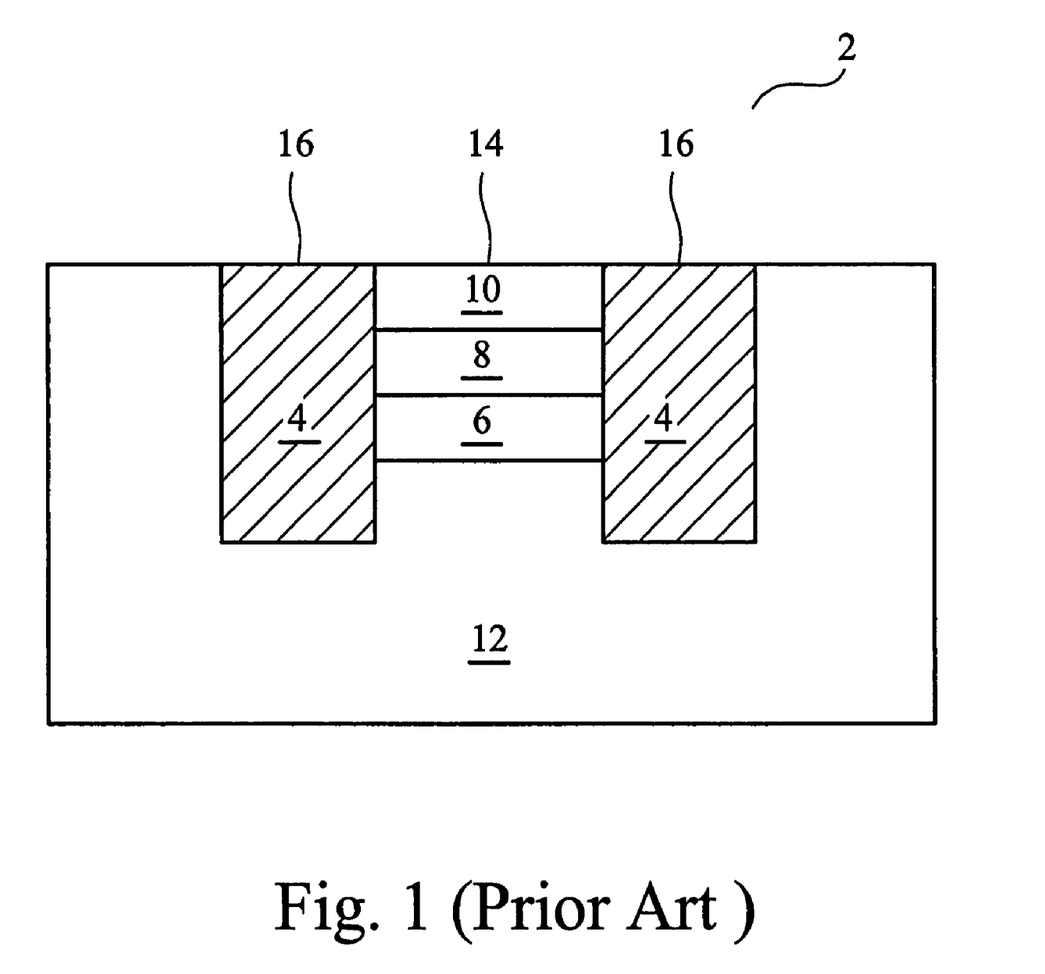
FIG. 1 illustrates a conventional vertical bipolar junction transistor formed in a substrate.

Due to small sizes and high scalability, vertical BJTs are good candidates for being used as selectors. FIG. 1 illustrates a conventional vertical PNP BJT 2, which is formed on substrate 12. PNP BJT 2 includes a p-type collector 6, an n-type base 8 on collector 6, and an emitter 10 on base 8. BJT 2 is encircled by an isolation structure 4, which has a top surface 14 level with or lower than a top surface 16 of isolation structure 4.

One drawback of the vertical BJTs is that with the scaling of integrated circuits, the depth of isolation structure 4 is reduced. For 45 nm technology and beyond, the depth of isolation structure is too small to accommodate all of the emitter 10, base 8 and collector 6. As a result, serious leakage may occur.

Therefore, what is needed in the art is a selector that may incorporate vertical BJTs to take advantage of the benefits associated with the small sizes and high scalability while at the same time overcoming the deficiencies of the prior art.

SUMMARY OF THE INVENTION

In accordance with one aspect of the present invention, a semiconductor structure includes a substrate; an isolation structure in the substrate, wherein the isolation structure defines a region therein; a first semiconductor region having at least a portion in the region defined by the isolation structure, wherein the first semiconductor region is of a first conductivity type; a second semiconductor region on the first semiconductor region, wherein the second semiconductor region is of a second conductivity type opposite the first conductivity type; and a third semiconductor region of the first conductivity type on the second semiconductor region, wherein the third semiconductor region has at least a portion higher than a top surface of the isolation structure.

In accordance with another aspect of the present invention, a semiconductor structure includes a substrate and a vertical bipolar transistor having at least a portion in the substrate. The vertical bipolar transistor includes a first region of a first conductivity type; a second region on the first region, wherein the second region is of a second conductivity type opposite the first conductivity type; and a third region of the first conductivity type on the second region, wherein at least a portion of the third region is higher than a top surface of the substrate.

In accordance with yet another aspect of the present invention, a semiconductor structure includes a substrate; an isolation structure in the substrate, wherein the isolation structure defines a region therein; a first p-type region having at least a portion in the region defined by the isolation structure; an n-type region on the first p-type region; a second p-type region on the n-type region, wherein the second p-type region has at least a portion higher than a top surface of the isolation structure; a silicide region on the second p-type region; and a resistive sense type memory cell. The resistive sense type memory cell includes a first electrode electrically connected to the silicide region; a second electrode; and a resistive sense type element between the first electrode and the second electrode.

In accordance with yet another aspect of the present invention, a method for forming a semiconductor structure includes providing a substrate; forming an isolation structure in the substrate, wherein the isolation structure defines a region therein; forming a first semiconductor region having at least a portion in the region defined by the isolation structure, wherein the first semiconductor region is of a first conductivity type; forming a second semiconductor region on the first semiconductor region, wherein the second semiconductor region is of a second conductivity type opposite the first conductivity type; and forming a third semiconductor region of the first conductivity type on the second semiconductor region, wherein the third semiconductor region has at least a portion higher than a top surface of the isolation structure.

In accordance with yet another aspect of the present invention, a method for forming and operating a semiconductor structure includes providing a substrate; forming an isolation structure in the substrate, wherein the isolation structure substantially encircles a region; implanting a p-type impurity into the region encircled by the isolation structure to form a first semiconductor region; forming a second semiconductor region on the first semiconductor region, wherein the second semiconductor region is of n-type; forming a third semiconductor region on the second semiconductor region, wherein the third semiconductor region is of p-type, and wherein the third semiconductor region has at least a portion higher than a top surface of the isolation structure; forming a silicide region on the second p-type region; and forming a phase change memory cell. The step of forming the phase change memory cell includes forming a first electrode electrically connecting the silicide region; forming a second electrode;

and forming a phase change element between the first electrode and the second electrode.

By forming at least a portion of the vertical bipolar junction transistor (BJT) over shallow trench isolation (STI) regions, vertical BJTs can be formed in small-scale integrated circuits.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A through 9 are cross-sectional views of intermediate stages in the manufacturing of an embodiment of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel vertical bipolar junction transistor (BJT) and the methods of forming the same are provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 2A:
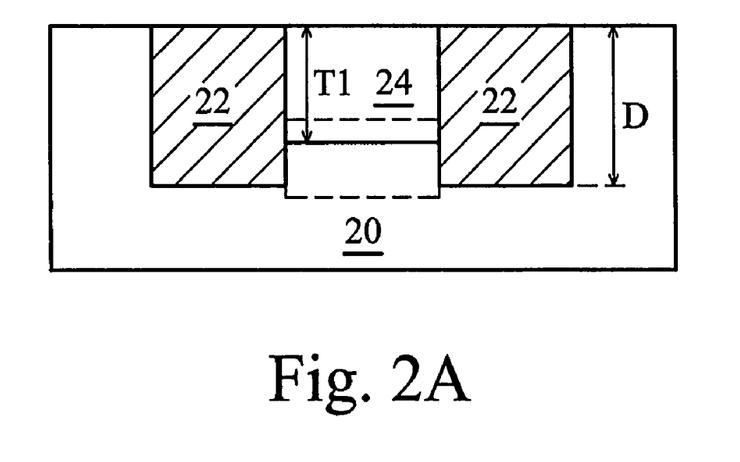

Referring to FIG. 2A, substrate 20 is provided. Substrate 20 is preferably a silicon substrate. Alternatively, other semiconductor materials such as SiGe and semiconductors formed of Group III and Group V elements can be used. In the preferred embodiment, substrate 20 is lightly doped with a p-type impurity. Alternatively, an n-type impurity may be doped. Isolation structures 22 are formed in substrate 20. Isolation structures 22 are preferably shallow trench isolation (STI) regions, which may be formed simultaneously with the formation of STI regions for isolating MOS devices.

Region 24 is a p-type region and is substantially encircled by isolation structures 22. In one embodiment, p-type region 24 comprises a same impurity with a same impurity concentration as substrate 20. Therefore, p-type region 24 is merely a sub-region of substrate 20, and no action needs to be taken for the formation of p-type region 24. In other embodiments, p-type region 24 is further doped with a p-type impurity, so that it has a higher impurity concentration than substrate 20. In an exemplary embodiment, the p-type impurity concentration in p-type region 24 is greater than about $1E16/cm^3$. In other embodiments, the p-type impurity concentration in p-type region 24 is between about $1E15/cm^3$ and about $1E16/cm^3$. P-type region 24 and isolation structures 22 may be formed in any order.

The doping of p-type region 24 is preferably performed by implantation, although other commonly used methods such as diffusion can be used. Alternatively, p-type region 24 is formed by etching substrate 20 to form a recess, and epitaxially growing semiconductor material in the recess, wherein a p-type impurity is doped while the epitaxial growth proceeds. In the case p-type region 24 comprises a different impurity concentration than that of substrate 20, a bottom surface of p-type region 24 is preferably at the same level, or lower than a bottom surface of isolation structures 22, which p-type region 24 is shown with dotted lines. More preferably, thickness T1 of region 24 is no less than three quarters of depth D of isolation structures 22. In an exemplary embodiment, thickness T1 of p-type region 24 is between about 150 nm and about 400 nm. One skilled in the art will realized, however, that the dimensions recited throughout the description are merely examples, and will be scaled with the scaling of formation technology.

Figure 2B:
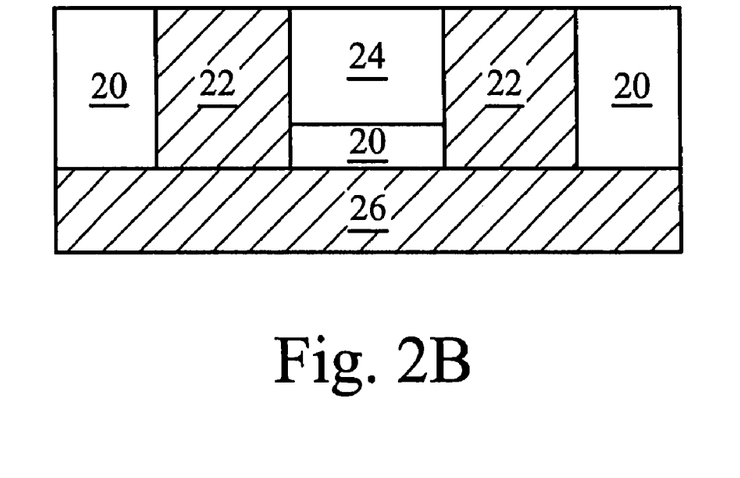

FIG. 2B illustrates an alternative embodiment of the present invention, wherein a silicon-on-insulator structure is used. Preferably, Isolation structures 22 extend on a top surface of buried oxide layer 26.

Figure 3:
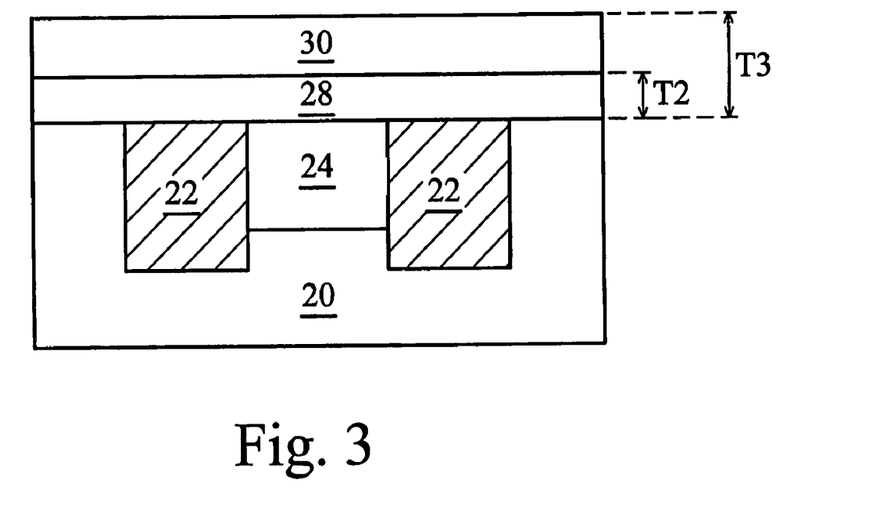

FIG. 3 illustrates the formation of n-type layer 28 and p-type layer 30, which are both semiconductor layers. The materials of n-type layer 28 and p-type layer 30 may comprise the same semiconductor material as p-type region 24 does. In the preferred embodiment, n-type layer 28 is formed by an epitaxial growth. Alternatively, other methods that can form crystalline structures, such as furnace batch type growth and atomic layer deposition, can be used. N-type impurities, such as phosphorous and/or arsenic, are preferably doped while n-type layer 28 is formed. N-type impurities may also be implanted or diffused after the formation of n-type layer 28.

Next, p-type layer 30 is formed on n-type layer 28. The method for forming p-type layer 30 may be the same as forming n-type layer 28. Preferably, at the time p-type layer 30 is formed, p-type impurities, such as boron and/or indium, are doped. Alternatively, p-type impurities are implanted after p-type layer 30 is formed. In an exemplary embodiment, n-type layer 28 has an impurity concentration of between about $1E16/cm^3$ and about $1E17/cm^3$, while p-type layer 30 has an impurity concentration of no less than about $1E20/cm^3$, and preferably between about $1E20/cm^3$ and about $1E22/cm^3$. A thickness T2 of n-type layer 28 is preferably no less than about 200 nm, for example, between about 200 nm and about 300 nm, while a thickness T3 of p-type layer 30 is preferably between about 150 nm and about 300 nm, and more preferably between about 200 nm and about 250 nm.

Figure 4:
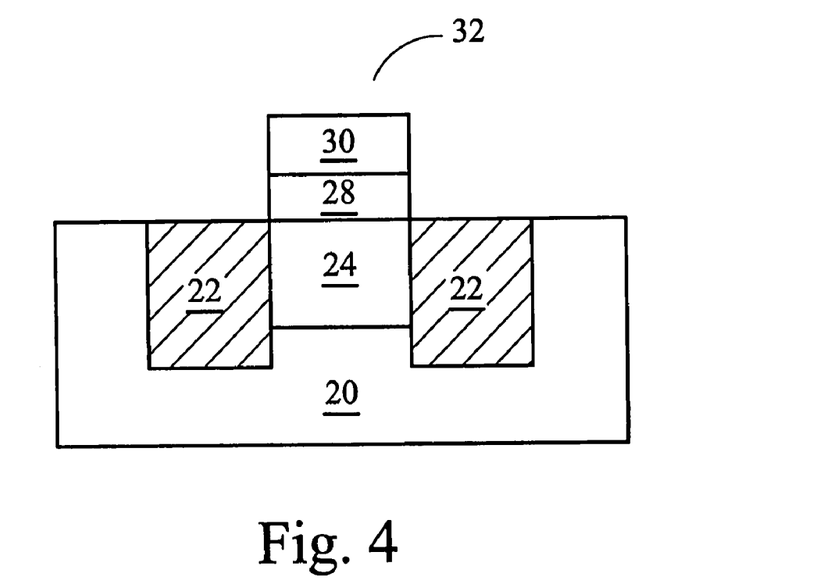

Referring to FIG. 4, n-type layer 28 and p-type layer 30 are patterned to form n-type region 28 and p-type region 30, respectively. A PNP bipolar junction transistor (BJT) 32 is thus formed. P-type region 24, n-type region 28 and p-type region 30 act as the collector, the base and the emitter of PNP BJT 32, respectively.

Figure 5A:
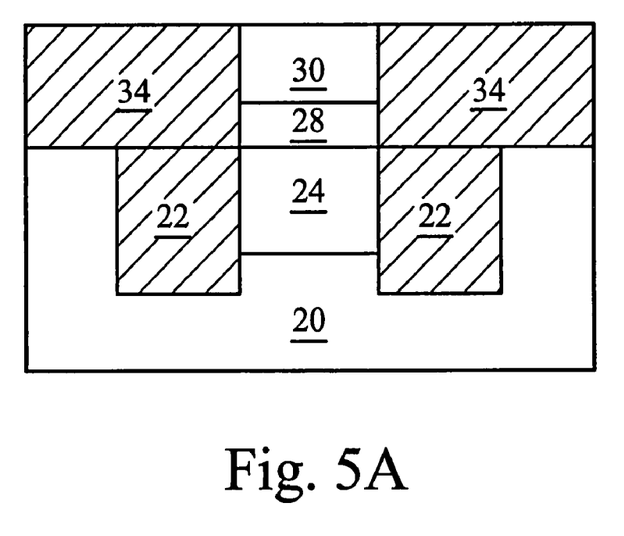

FIG. 5A illustrates the formation of a dielectric layer 34, which may include commonly used materials used for forming an inter-layer dielectric, such as carbon-containing materials. Alternatively, silicon nitride, silicon oxynitride, silicon carbide, and the like may be used. Preferably, dielectric layer 34 is blanket formed to a thickness greater than the combined thickness of regions 28 and 30. A chemical mechanical polish (CMP) is then performed to planarize dielectric layer 34, and thus exposing p-type region 30.

Figure 6A:
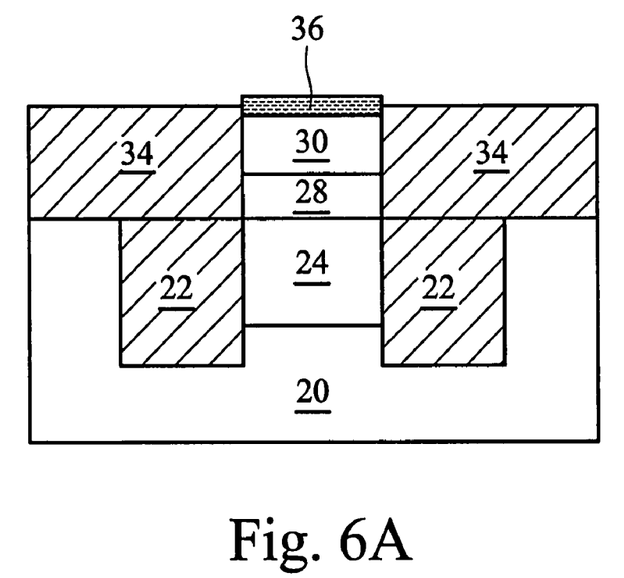

In FIG. 6A, metal silicide 36 is formed on p-type region 30 to improve the contact, preferably using self-aligned silicidation (salicide) process. As is known in the art, metal silicides may be formed by blanket forming a thin metal layer, heating the substrate so that the metal layer reacts with exposed silicon to form a silicide layer. Un-reacted metal is then removed using an etchant that attacks metal, but not the silicide.

Figure 5B:
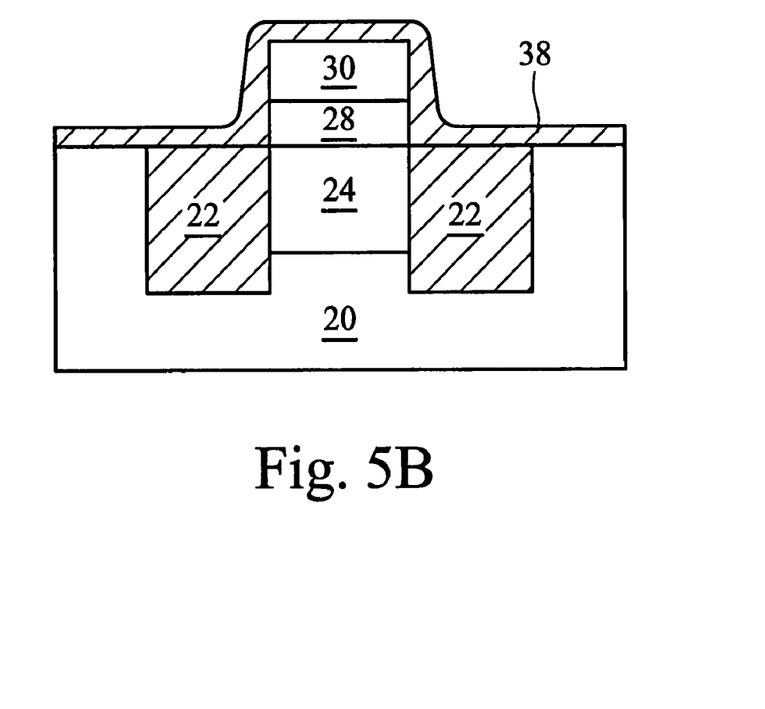
Figure 6B:
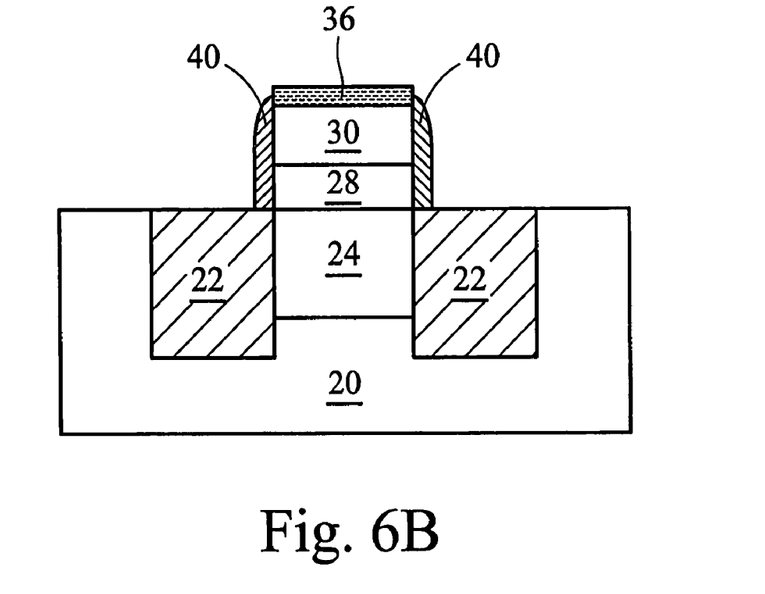

FIGS. 5B and 6B illustrate another embodiment, wherein sidewall spacers are formed for n-type region 28 and p-type region 30. In FIG. 5B, a dielectric layer 38 is blanket formed. Dielectric layer 38 may comprise materials such as nitrides, oxides, oxycarbides, and combinations thereof. The thickness of dielectric layer 38 is preferably less than a combined thickness of n-type region 28 and p-type region 30.

Referring to FIG. 6B, dielectric layer 38 is etched, and horizontal portions are removed. The remaining portions of dielectric layer 38 form spacers 40, which protect sidewalls of p-type region 30 and n-type region 28. Silicide region 36 is then formed.

Figure 7A:
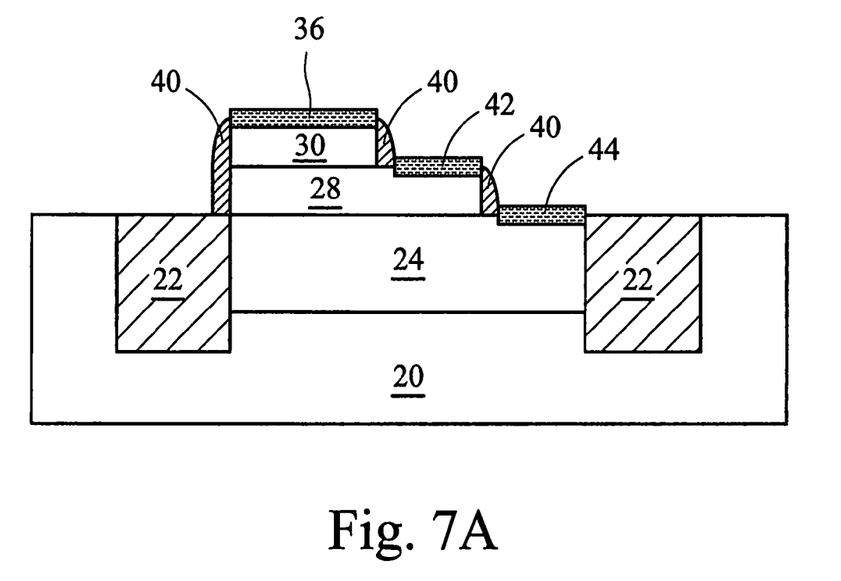

It is realized that n-type region 28 and p-type region 24 may act as a base and a collector of PNP transistor 32, respectively, contacts are thus needed to connect to n-type region 28 and p-type region 24. FIG. 7A illustrates another exemplary embodiment for forming silicide regions on regions 28 and 24. FIG. 7A illustrates a cross-sectional view taken from a plane perpendicular to the plane of FIGS. 2 through 6B. In an exemplary embodiment, after the structure as shown in FIG. 3 is formed, n-type layer 28 and p-type layer 30 are patterned, wherein the resulting n-type region 28 and p-type region 24 each have a portion exposed through the overlying regions. A dielectric layer, which is essentially the same as dielectric layer 38 shown in FIG. 5B, is formed. Horizontal portions of the dielectric layer are then removed, and spacers 40 are formed. In the subsequent process steps, silicide regions 36, 42 and 44 are formed by a salicide process.

Figure 7B:
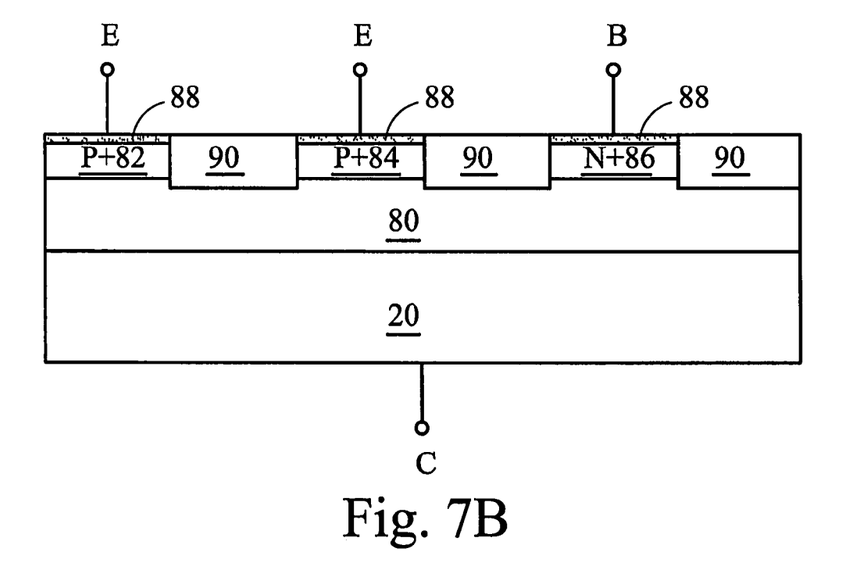

FIG. 7B illustrates a further embodiment for forming contacts to the p-type and n-type regions. In this embodiment, n-well region 80 is formed on p-type substrate 20. Insulation regions are formed on n-well region 80, and separating P+ regions 82 and 84, and N+ region 86. Silicide regions 88 are used for improving the contact to regions 82, 84 and 86. N− well region 80 acts as the base region, and N+ region 86 is the contact to the base region. Each of the P+ regions 82 and 84 may form a PNP transistor with base region 80 and substrate 20, which acts as the collector, wherein a connection may be made to substrate 20.

Figure 8:
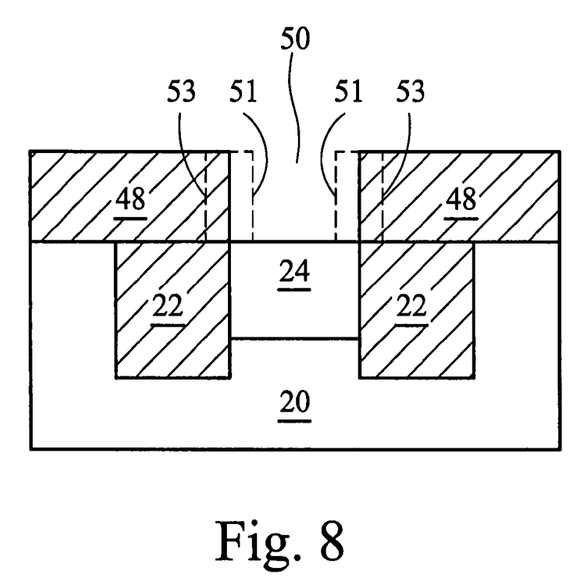

FIG. 8 illustrates a further embodiment for forming n-type region 28 and p-type region 30. Referring to FIG. 8, a dielectric layer 48 is formed. An opening 50 is formed by patterning dielectric layer 48, wherein a top surface of p-type region 24 is exposed through opening 50. Opening 50 may be smaller than p-type region 24, wherein exemplary edges 51 are illustrated. Alternatively, opening 50 may be greater than p-type region 24, as defined by edges 53. N-type region 28 and p-type region 30 are then sequentially formed to substantially fill opening 50. The resulting structure is similar to what is shown in FIG. 5A. N-type region 28 and p-type region 30 may be formed by a selective epitaxial growth method or a chemical vapor deposition (CVD) method. Silicide region 36 is then formed.

Figure 9:
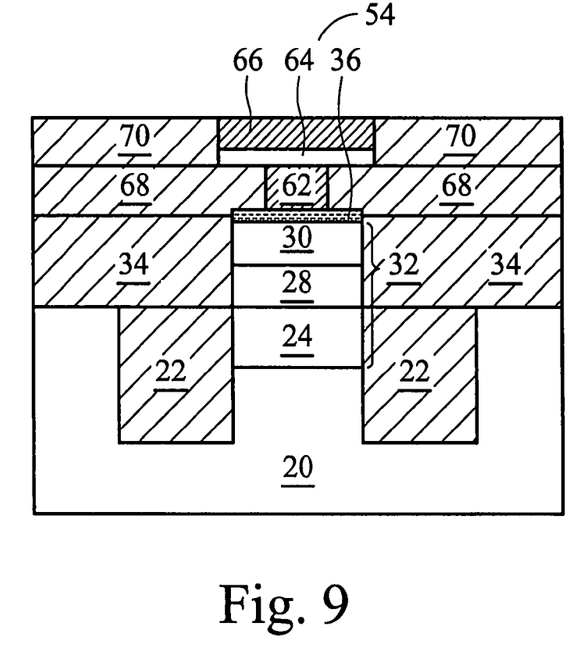

FIG. 9 illustrates an exemplary embodiment for connecting a resistive sense type memory cell to the structure formed in preceding steps. The resistive sense type memory cell may be selected from a phase change memory cell, a spin transfer torque memory cell, a magnetic tunnel junction (MTJ) memory, a tunnel magneto-resistance (TMR) memory cell, a giant magneto-resistance (GMR), and the like. FIG. 9 illustrates the formation of phase change memory cell 54, which is electrically connected to silicide region 36. One skilled in the art will realize the formation and connection of other resistive sense type memory cells. Phase change memory cell 54 includes a bottom electrode 62, a top electrode 66 and a phase change element 64 therebetween. Dielectric layers 68 and 70 are formed for isolating phase change memory cell 54. It is to be realized that phase change memory cells have many variations, and memory cell 54 is merely an example.

In one preferred embodiment, bottom electrode contact 62 is formed by depositing a metal layer, and then etching the metal layer to form a desired shape. In other embodiments, bottom electrode 62 is formed by well-known damascene processes, which include forming insulating layers 68, forming an opening in insulating layers 68, and filling a conductive material, such as copper or copper alloy, into the opening. CMP is used to planarize the filling material, and the remaining portion of the filling material is bottom electrode 62.

Phase change element 64 and top electrode 66 are then formed. Phase change element 64 preferably comprises commonly used chalcogenide materials including one or more of Ge, Te, and Sb, e.g., preferably GeSbTe or stoichiometric materials. In an exemplary embodiment, a phase change material and a top electrode layer are blanket formed. The formation methods of phase change material and top electrode layer may include commonly used methods such as CVD, plasma enhanced CVD (PECVD), and the like. A lithographic patterning process followed by an etching process (e.g., anisotropic dry/RIE) is then carried out to form the phase change element 64 and top electrode 66.

In the resulting structure, BJT 32 acts as a selector for controlling the operations of phase change memory cell 54. During read, set or reset operations, control voltages are applied to base 28, and currents may flow to phase change memory cell 54. In a set operation, BJT 32 passes a high current, and phase change element 64 is heated up to a temperature higher than the melting temperature. The temperature is then quickly dropped below the crystallization temperature. At least a portion of the phase change element 64 is changed to an amorphous state with a high resistivity, thus the state of phase change memory cell 54 is changed to a high-resistance state. During a reset operation, BJT 32 passes a current higher enough to heat up phase change element 64 to a temperature high than the crystallization temperature, but below the melting temperature, for a certain period. Phase change memory cell 54 thus returns to a crystalline state.

Figure 10:
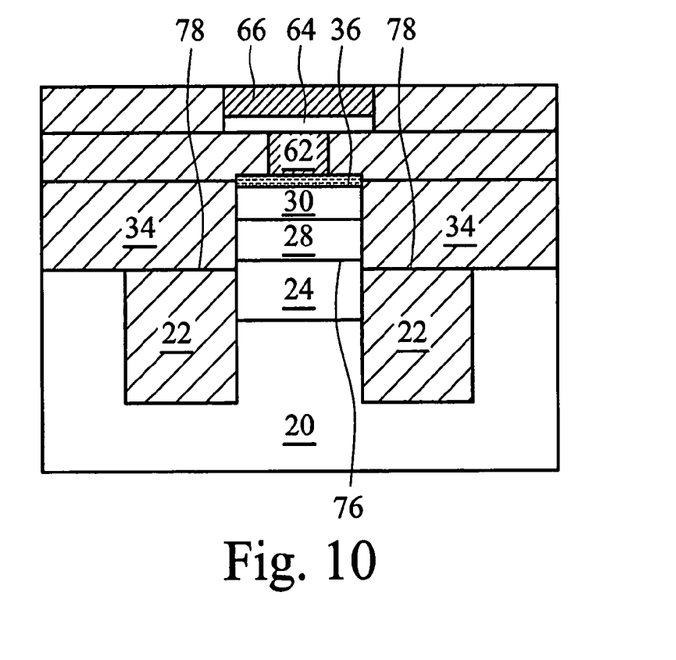
FIGS. 10 through 13 are variations of the embodiments of the present invention.

Variations of the preferred embodiment are illustrated in FIGS. 10 through 13. Referring to FIG. 10, p-type region 24 has a top surface 76 higher than top surfaces 78 of isolation structures 22. In the preferred embodiment, top surface 76 of p-type region 24 is raised by performing an additional epitaxial growth, wherein p-type impurities are doped when the epitaxial growth proceeds. N-type region 28 and p-type region 30 are then formed using essentially same methods as discussed in preceding paragraphs.

Figure 11:
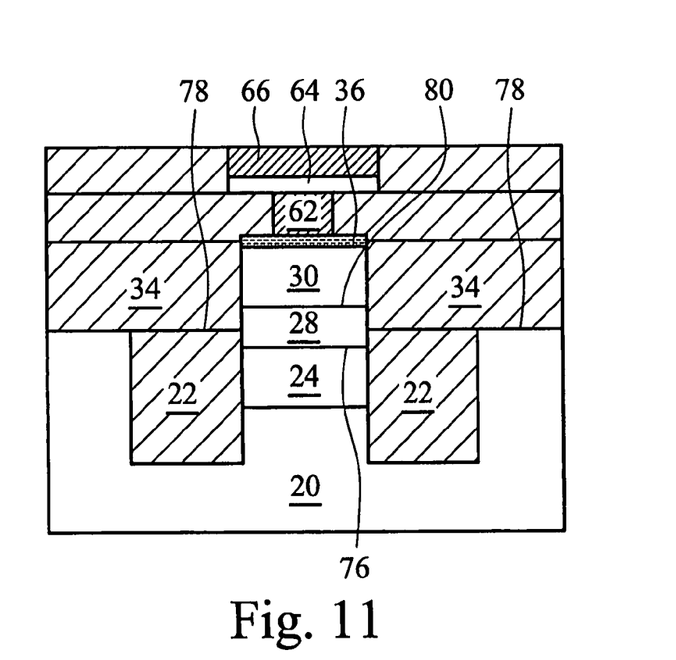
Figure 12:
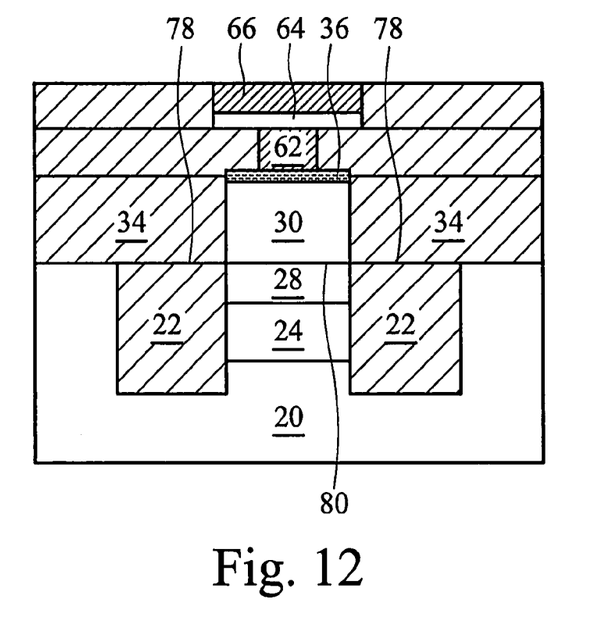

FIG. 11 illustrates another embodiment, wherein top surface 76 of p-type region 24 is lower than top surfaces 78 of isolation structures 22. In the preferred embodiment, top surface 76 of p-type region 24 is recessed, for example, by etching. N-type region 28 is then formed. In a first embodiment, n-type region 28 continues to be formed after the recess is filled, so that a top surface 80 of n-type region 28 is higher than top surface 78 of isolation structures 22. In a second embodiment, as is illustrated in FIG. 12, the formation of n-type region 28 stops when top surface 80 of n-type region 28 is substantially level with top surfaces 78 of isolation structures 22. Alternatively, in each of the embodiments shown in FIGS. 11 and 12, instead of doping impurities while epitaxial growth proceeds, implantation may be preformed to form n-type region 28.

Figure 13:
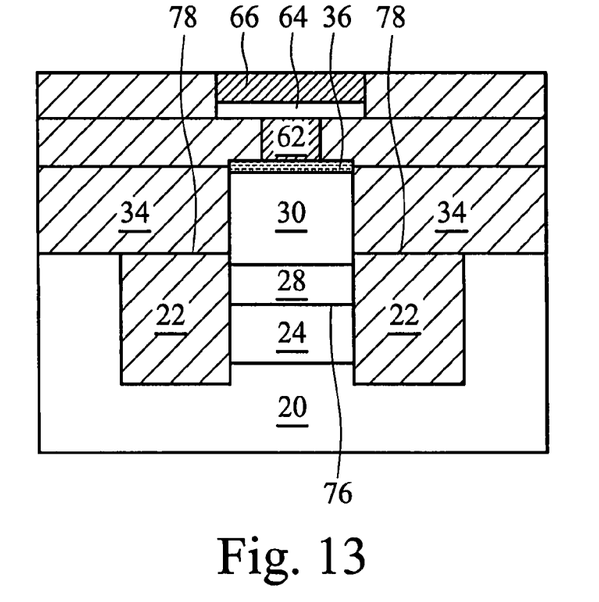

FIG. 13 illustrates a further embodiment of the present invention, wherein n-type region 28 is formed lower than top surfaces 78 of isolation structures 22, and a portion of p-type region 30 is also lower than top surfaces 78 of isolation structures 22. Again, n-type region 28 may be formed by recessing top surface 76 of p-type region 24, and epitaxially growing a semiconductor material with impurities doped at the same time. Alternatively, n-type region 28 maybe formed by implantation.

In the embodiment discussed in the preceding paragraphs, PNP transistors are formed. One skilled in the art will realize that similar process steps may be used for forming NPN transistors, wherein the conductivity type of substrate 20, regions 24, 28 and 30 are inversed. One skilled in the art will realize the corresponding process steps.

The embodiments of the present invention have several advantageous features. Since at least portions of the vertical transistors are raised over top surfaces of respective isolation structures, vertical transistors can be formed even though the depth of isolation structures are less than the thicknesses of vertical transistors. Therefore, vertical BJT can be used even if the scale of integrated circuits fall below 45 nm. Accordingly, scalability of the selectors, which are formed of vertical BJTs, is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate;
   an isolation structure in the substrate, wherein the isolation structure defines a region therein;
   a first semiconductor region having at least a portion in the region defined by the isolation structure, wherein the first semiconductor region is of a first conductivity type;
   a second semiconductor region on a top surface of the first semiconductor region, wherein the second semiconductor region is of a second conductivity type opposite the first conductivity type; and
   a third semiconductor region of the first conductivity type on a top surface of the second semiconductor region, wherein the third semiconductor region has at least a portion higher than a top surface of the isolation structure, wherein at least one sidewall of the third semiconductor region is collinear with at least one entire sidewall of the second semiconductor region directly under the third semiconductor region.

2. The semiconductor structure of claim 1, wherein the first conductivity type is p-type and the second conductivity type is n-type.

3. The semiconductor structure of claim 1 further comprising a resistive sense type memory cell selected from the group consisting essentially of a phase change memory cell, a spin transfer torque memory cell, a magnetic tunnel junction (MTJ) memory, a tunnel magneto-resistance (TMR) memory cell, and a giant magneto-resistance (GMR).

4. The semiconductor structure of claim 1, wherein the top surface of the first semiconductor region is substantially level with the top surface of the isolation structure.

5. The semiconductor structure of claim 1, wherein the top surface of the first semiconductor region is higher than the top surface of the isolation structure.

6. The semiconductor structure of claim 1, wherein the top surface of the first semiconductor region is lower than the top surface of the isolation structure.

7. The semiconductor structure of claim 6, wherein the top surface of the second semiconductor region is lower than the top surface of the isolation structure.

8. The semiconductor structure of claim 1 further comprising a silicide region on the third semiconductor region.

9. The semiconductor structure of claim 1, wherein the first semiconductor region and the substrate have an interface higher than a bottom surface of the isolation structure.

10. A semiconductor structure comprising:
    a substrate;
    an isolation structure in the substrate, wherein the isolation structure defines a region therein;
    a first semiconductor region having at least a portion in the region defined by the isolation structure, wherein the first semiconductor region is of a first conductivity type;
    a second semiconductor region on the first semiconductor region, wherein the second semiconductor region is of a second conductivity type opposite the first conductivity type; and
    a third semiconductor region of the first conductivity type on the second semiconductor region, wherein the third semiconductor region has at least a portion higher than a top surface of the isolation structure, wherein the first semiconductor region and the substrate are doped with a same impurity having a same impurity concentration.

11. A semiconductor structure comprising:
    a substrate;
    an isolation structure in the substrate, wherein the isolation structure defines a region therein;
    a first semiconductor region having at least a portion in the region defined by the isolation structure, wherein the first semiconductor region is of a first conductivity type;
    a second semiconductor region on the first semiconductor region, wherein the second semiconductor region is of a second conductivity type opposite the first conductivity type; and
    a third semiconductor region of the first conductivity type on the second semiconductor region, wherein the third semiconductor region has at least a portion higher than a top surface of the isolation structure, wherein the first semiconductor region and the substrate have an interface higher than a bottom surface of the isolation structure and wherein the interface and the bottom surface of the isolation structure have a vertical distance no less than about three quarters of a depth of the isolation structure.

12. A semiconductor structure comprising:
    a substrate; and
    a vertical bipolar transistor having at least a portion in the substrate, wherein the vertical bipolar transistor comprises:
    a first region of a first conductivity type;
    a second region on the first region, wherein the second region is of a second conductivity type opposite the first conductivity type; and
    a third region of the first conductivity type on the second region, wherein at least a portion of the third region is higher than a top surface of the substrate, wherein at least one entire end of the second region is aligned with at least one end of the third region.

13. The semiconductor structure of claim 12, wherein the vertical bipolar transistor is a PNP transistor.

14. The semiconductor structure of claim 12, wherein the vertical bipolar transistor is an NPN transistor.

15. The semiconductor structure of claim 12 further comprising a resistive sense type memory cell, wherein an emitter of the vertical bipolar transistor is connected to an electrode of the resistive sense type memory cell.

16. The semiconductor structure of claim 15, wherein the vertical bipolar transistor is substantially encircled by dielectric materials.

17. A semiconductor structure comprising:
   a substrate;
   an isolation structure in the substrate, wherein the isolation structure defines a region therein;
   a first p-type region having at least a portion in the region defined by the isolation structure;
   an n-type region on the first p-type region;
   a second p-type region on the n-type region, wherein the second p-type region has at least a portion higher than a top surface of the isolation structure;
   a silicide region on the second p-type region; and
   a resistive sense type memory cell comprising:
      a first electrode electrically connected to the silicide region;
      a second electrode; and
      a resistive sense type element between the first electrode and the second electrode.

18. The semiconductor structure of claim 17, wherein a bottom surface of the first p-type region is lower than a bottom surface of the isolation structure.

19. The semiconductor structure of claim 17, wherein the isolation structure has at least a portion encircling at least a portion of the first p-type region.

* * * * *